United States Patent
Jhan et al.

(10) Patent No.: US 11,967,571 B2
(45) Date of Patent: Apr. 23, 2024

(54) SEMICONDUCTOR STRUCTURE AND FORMING METHOD THEREFOR

(71) Applicant: FUJIAN JINHUA INTEGRATED CIRCUIT CO., LTD., Fujian (CN)

(72) Inventors: Yi-Wang Jhan, Fujian (CN); Yung-Tai Huang, Fujian (CN); Xin You, Fujian (CN); Xiaopei Fang, Fujian (CN); Yu-Cheng Tung, Fujian (CN)

(73) Assignee: FUJIAN JINHUA INTEGRATED CIRCUIT CO., LTD., Quanzhou (CN)

( * ) Notice: Subject to any disclaimer, the term of this patent is extended or adjusted under 35 U.S.C. 154(b) by 441 days.

(21) Appl. No.: 17/290,040

(22) PCT Filed: Mar. 17, 2020

(86) PCT No.: PCT/CN2020/079582
§ 371 (c)(1),
(2) Date: Apr. 29, 2021

(87) PCT Pub. No.: WO2021/022811
PCT Pub. Date: Feb. 11, 2021

(65) Prior Publication Data
US 2021/0407936 A1 Dec. 30, 2021

(30) Foreign Application Priority Data
Sep. 29, 2019 (CN) .......................... 201910936710.8

(51) Int. Cl.
*H01L 29/10* (2006.01)
*H01L 21/8234* (2006.01)
(Continued)

(52) U.S. Cl.
CPC ...... *H01L 24/05* (2013.01); *H01L 21/823462* (2013.01); *H01L 21/823475* (2013.01);
(Continued)

(58) Field of Classification Search
CPC . H01L 24/05; H01L 29/0891; H01L 29/1033; H01L 29/1079; H01L 21/823475;
(Continued)

(56) References Cited

U.S. PATENT DOCUMENTS 5,907,788 A 5/1999 Kasai
7,153,727 B2 * 12/2006 Lee .................. H01L 21/76831
257/E21.507

(Continued)

*Primary Examiner* — Eduardo A Rodela
(74) *Attorney, Agent, or Firm* — MUNCY, GEISSLER, OLDS & LOWE, PC

(57) ABSTRACT

A semiconductor structure and a method of fabricating therefor are disclosed. A second contact pad (500) is arranged lateral to a first contact pad (420) in an interconnect structure (400). As a result, during fabrication of the interconnect structure (400), the first contact pad (420) will not be present alone in a large bland area, due to the presence of the second contact pad (500). Thus, a pattern feature for the first contact pad (420) will not be over-resolved, increasing formation accuracy of the first contact pad (420) and thus guaranteeing good electrical transmission performance of the resulting interconnect structure (400).

17 Claims, 4 Drawing Sheets

(51) Int. Cl.
 *H01L 23/00* (2006.01)
 *H01L 29/417* (2006.01)
(52) U.S. Cl.
 CPC .......... *H01L 24/03* (2013.01); *H01L 29/1033* (2013.01); *H01L 29/41775* (2013.01); *H01L 2224/036* (2013.01); *H01L 2224/0508* (2013.01); *H01L 2224/05099* (2013.01)
(58) Field of Classification Search
 CPC ......... H01L 21/823871; H01L 29/6656; H01L 29/66689; H01L 29/66719; H01L 29/515; H01L 21/823468; H01L 21/823864; H01L 21/28247; H01L 21/76834; H01L 21/7685; H01L 21/76852; H01L 21/28114
 See application file for complete search history.

(56) References Cited

U.S. PATENT DOCUMENTS

| | | | |
|---|---|---|---|
| 8,940,635 B1 * | 1/2015 | Chi | H01L 23/53223 |
| | | | 438/631 |
| 9,502,267 B1 | 11/2016 | Chi et al. | |
| 10,043,800 B2 * | 8/2018 | Kim | H01L 21/823431 |
| 10,825,910 B1 * | 11/2020 | Zang | H01L 21/76831 |
| 2009/0115065 A1 | 5/2009 | Shim | |
| 2019/0198468 A1 | 6/2019 | Usami | |

* cited by examiner

SEMICONDUCTOR STRUCTURE AND FORMING METHOD THEREFOR

TECHNICAL FIELD

The present invention relates to the field of semiconductor technology and, in particular, to semiconductor structure and a forming method therefor.

BACKGROUND

In semiconductor structures, electrical transmission between semiconductor devices is usually accomplished by interconnects. Therefore, electrical transmission performance of interconnects is very important. However, the fabrication of current interconnects often suffers from deformation of pattern features for contact pads, which may degrade the contact between the contact pads and other electrical transmission components and hence electrical transmission performance of the resulting interconnects.

SUMMARY OF THE INVENTION

It is an objective of the present invention to provide a semiconductor structure which overcomes the problem of poor electrical transmission performance of interconnects in existing semiconductor structures.

To this end, the provided semiconductor structure includes:

a substrate on which at least one semiconductor device and an interlayer dielectric layer are formed, the interlayer dielectric layer covering each semiconductor device;

an interconnect structure including a contact plug and a first contact pad, the contact plug extending through the interlayer dielectric layer to the semiconductor device, the first contact pad covering a top of the contact plug and extending laterally over part of a top surface of the interlayer dielectric layer; and a second contact pad formed on the top surface of the interlayer dielectric layer and spaced apart from a side edge of the first contact pad.

Optionally, the semiconductor device may include a gate conductive layer formed on a top surface of the substrate, wherein the interlayer dielectric layer includes a shielding layer covering a top surface of the gate conductive layer, wherein the contact plug is formed on a side edge of the gate conductive layer, and wherein the first contact pad extends laterally from the side edge of the gate conductive layer over the shielding layer.

Optionally, the second contact pad may be formed on the shielding layer and spaced apart from the first contact pad.

Optionally, a width of the first contact pad over the shielding layer may be smaller than a width of the second contact pad.

Optionally, the interlayer dielectric layer may further include an isolation spacer covering a side surface of the gate conductive layer, wherein the contact plug is formed on a side of the isolation spacer away from the gate conductive layer, and wherein the first contact pad extends laterally over the isolation spacer adjacent to the contact plug.

Optionally, the interlayer dielectric layer may further include an isolation dielectric layer surrounding the gate conductive layer, wherein the contact plug extends through the isolation dielectric layer.

Optionally, the first and second contact pads may be made of the same materials.

Optionally, each of the first and second contact pads may include a first conductive layer and a second conductive layer formed on the first conductive layer, the first conductive layer in the first contact pad made of the same material as the first conductive layer in the second contact pad, the second conductive layer in the first contact pad made of the same material as the second conductive layer in the second contact pad.

The present invention also provides another semiconductor structure including:

a substrate on which at least one semiconductor device and an interlayer dielectric layer are formed, the interlayer dielectric layer covering each semiconductor device;

an interconnect structure including a contact plug and a first contact pad, the contact plug extending through the interlayer dielectric layer to the semiconductor device, the first contact pad covering a top of the contact plug and extending laterally over part of a top surface of the interlayer dielectric layer;

a second contact pad formed on the top surface of the interlayer dielectric layer and spaced apart from a side edge of the first contact pad; and a trench between the first and second contact pads, the trench extending downward into the interlayer dielectric layer.

Optionally, a side surface of the first contact pad and a side surface of the second contact pad may be both partially exposed in the trench, wherein the semiconductor structure further includes an isolation plug filling the trench and covering the side surfaces of the first and second contact pads exposed in the trench.

Optionally, a gap may be formed in the isolation plug.

Optionally, the semiconductor device may include a gate conductive layer formed on a top surface of the substrate, wherein the interlayer dielectric layer includes a shielding layer covering a top surface of the gate conductive layer, wherein the contact plug is formed on a side edge of the gate conductive layer, wherein the first contact pad extends laterally from the side edge of the gate conductive layer over the shielding layer, wherein the second contact pad is formed on the shielding layer and spaced apart from the first contact pad, and wherein the trench between the first and second contact pads extends downward into the shielding layer.

It is another object of the present invention to provide a method of fabricating a semiconductor structure. The method includes:

providing a substrate formed thereon with at least one semiconductor device and an interlayer dielectric layer covering the semiconductor device;

forming a contact hole in the interlayer dielectric layer, the contact hole extending through the interlayer dielectric layer to the semiconductor device;

forming a conductive material layer on the interlayer dielectric layer, the conductive material layer filling the contact hole and covering a top surface of the interlayer dielectric layer; and forming an interconnect structure and a second contact pad by patterning the conductive material layer, the interconnect structure including a contact plug filled in the contact hole and a first contact pad covering a top of the contact plug, the second contact pad spaced apart from a side edge of the first contact pad.

Optionally, patterning the conductive material layer may include:

forming a mask layer on the conductive material layer, the mask layer having a first mask pattern and a second mask pattern, the first mask pattern covering the contact hole and a partial area surrounding the contact hole, the second mask pattern formed on a side edge of the first mask pattern and spaced apart from the first mask pattern by a predetermined distance; and etching the conductive material layer with the mask layer serving as an etching mask to form the interconnect structure corresponding to the first mask pattern and the second contact pad corresponding to the second mask pattern.

Optionally, the method may further include, subsequent to the patterning of the conductive material layer, performing an etching process on the interlayer dielectric layer between the first and second contact pads and stopping the etching process in the interlayer dielectric layer to form a trench.

Optionally, a side surface of the first contact pad and a side surface of the second contact pad may be both partially exposed in the trench, wherein the method further includes, subsequent to formation of the trench, filling the trench with an isolation plug, the isolation plug covering the side surface of the first contact pad and the side surface of the second contact pad exposed in the trench.

In the semiconductor structures of the present invention, the presence of the second contact pad beside the first contact pad in the interconnect avoids the first contact pad from being present alone in a large bland area. In this way, during the fabrication of the interconnect, a pattern feature for the first contact pad will not be over-resolved due to the presence of the second contact pad, thereby increasing formation accuracy of the first contact pad and hence guaranteeing good electrical transmission performance of the resulting interconnect.

LIST OF REFERENCE NUMERALS IN THE DRAWINGS

100—Substrate;
110—First Source/Drain Region;
120—Second Source/Drain Region;
200—Gate Conductive Layer;
210—Third Conductive Layer;
220—Fourth Conductive Layer;
230—Fifth Conductive Layer;
300—Interlayer Dielectric Layer;
310—Shielding Layer;
320—Spacer;
321—First Spacing Layer;
322—Second Spacing Layer;
323—Third Spacing Layer;
330—Isolation Dielectric Layer;
400—Interconnect structure;
410—Contact Plug;
420—First Contact Pad;
500—Second Contact Pad;
600—Isolation plug;
610—Gap;
600a—Trench;
700—Conductive Material Layer;
700a—Contact Hole;
710—First Conductive Layer;
720—Second Conductive Layer.

DETAILED DESCRIPTION

As mentioned in the Background section, the fabrication of existing semiconductor structures often suffers from deformation of pattern features for contact pads in interconnects.

In order to overcome this problem, the inventors have found from research that, in practical patterning processes usually employed in the fabrication of interconnects to create pattern features for contact pads, patterning accuracy is often affected by the density of pattern features. When pattern features are arranged too densely, it is often difficult to resolve them from one another and adjacent pattern features tend to be joined together. On the other hand, when pattern features are arranged too sparsely, they tend to be over-resolved, leading to the problems of corrugations or notches. For interconnects, since their contact pads are usually formed alone in big blank areas, during the fabrication of such contact pads, pattern features for them tend to experience deformation, which is detrimental to electrical transmission performance of the resulting interconnects.

In view of this, the present invention proposes semiconductor structures, which less suffer from deformation of pattern features for contact pads of interconnects therein.

Semiconductor structures and methods of fabricating them proposed in the present invention will be described in greater detail below by way of specific embodiments with reference to the accompanying drawings. Advantages and features of the present invention will be more apparent from the following detailed description. Note that the figures are provided in a very simplified form not necessarily drawn to exact scale, and they are only intended to facilitate convenience and clarity in explaining the disclosed embodiments.

Figure 1:
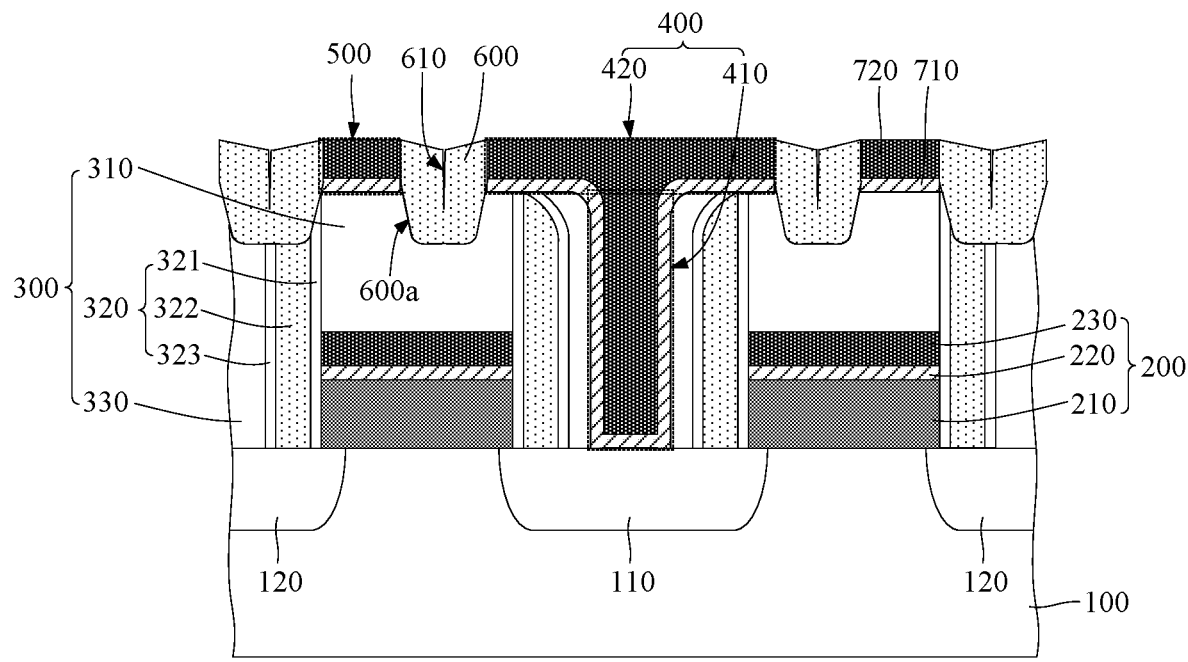
FIG. 1 is a schematic illustration of a semiconductor structure according to an embodiment of the present invention.

FIG. 1 is a schematic illustration of a semiconductor structure according to an embodiment of the present invention. As illustrated in FIG. 1, the semiconductor structure includes:

a substrate 100, at least one semiconductor device and an interlayer dielectric layer 300 are formed on the substrate 100, the interlayer dielectric layer 300 covers the semiconductor device;

an interconnect structure 400, the interconnect structure 400 including a contact plug 410 and a first contact pad 420, the contact plug 410 extending through the interlayer dielectric layer 300 to the semiconductor device and being electrically connected to the semiconductor device, the first contact pad 420 covering a top of the contact plug 410 and extending laterally over part of a top surface of the interlayer dielectric layer 300; and a second contact pad 500 formed on the top surface of the interlayer dielectric layer 300 and spaced laterally apart from the first contact pad 420.

In this embodiment, forming the second contact pad 500 beside the first contact pad 420 can avoid the first contact pad 420 from being present in a large bland area, which is favorable to good morphological quality of the resulting first contact pad 420. For example, during the formation of the first contact pad 420, the second contact pad 500 beside the first contact pad 420 can protect the first contact pad 420 from significant damage from etching processes. As a result, defects in the first contact pad 420 such as notches or shape irregularities can be avoided.

The first and second contact pads 420, 500 may be fabricated from the same conductive material layers. That is, the first and second contact pads 420, 500 may be made of the same materials. In this embodiment, each of the first and second contact pads 420, 500 may include a first conductive layer 710 and a second conductive layer 720, the second conductive layer 720 is formed on the first conductive layer 710. The first conductive layer 710 in the first contact pad 420 may be made of the same material as the first conductive layer 710 in the second contact pad 500, and the second conductive layer 720 in the first contact pad 420 may be made of the same material as the second conductive layer 720 in the second contact pad 500. The material of the first conductive layers 710 may include, for example, titanium nitride, and the material of the second conductive layers 720 may include, for example, tungsten.

The contact plug 410 and the first contact pad 420 in the interconnect structure 400 may be formed simultaneously of the same materials. That is, in this embodiment, the contact plug 410 may also include a first conductive layer 710 and a second conductive layer 720, the second conductive layer 720 is formed on the first conductive layer 710. Specifically, the contact plug 410 may be formed in a contact hole in the interlayer dielectric layer 300, with the first conductive layer 710 in the contact plug 410 covering an inner surface of the contact hole and the second conductive layer 720 in the contact plug 410 filling up the contact hole.

With continued reference to FIG. 1, optionally, the first and second contact pads 420, 500 may be spaced from each other by a trench 600a, the trench 600a extends downward into the interlayer dielectric layer 300.

Specifically, in the case of the first and second contact pads 420, 500 being fabricated from the same conductive material layers, in order to ensure that the first and second contact pads 420, 500 are electrically isolated from each other, after the conductive material layers are etched through, a portion of the interlayer dielectric layer 300 between the first and second contact pads 420, 500 may also be etched away to ensure that the first and second contact pads 420, 500 are separated from each other, resulting in the formation of the trench 600a.

In this embodiment, the semiconductor structure may further include an isolation plug 600, the isolation plug 600 fills the trench 600a and covers side surfaces of the first and second contact pads 420, 500 exposed in the trench 600a.

Additionally, a gap 610 may be formed in the isolation plug 600 in the trench 600a. In this embodiment, the gap 610 may extend vertically at the middle of the trench 600a in a height-wise direction.

Optionally, a top of the gap 610 may be located above the top surface of the interlayer dielectric layer 300 so that a portion of the gap 610 is situated between the first and second contact pads 420, 500. That is, the gap 610 in the isolation plug 600 may be located between laterally opposing portions of the first and second contact pads 420, 500. This can reduce the dielectric constant of the dielectric material between the first and second contact pads 420, 500, thus effectively mitigating parasitic capacitance between the first and second contact pads 420, 500. In this embodiment, the gap 610 may vertically extend downward from a top surface of the isolation plug 600.

Additionally, the gap 610 formed in the isolation plug 600 can relieve internal stress in the isolation plug 600, protecting the adjacent contact pads and semiconductor device from possible damage from strong internal stress in the isolation plug 600. For example, when a high-temperature process is performed on the semiconductor structure, effective stress relief can be provided by the gap 610 in the isolation plug 600. In this way, the isolation plug 600 will not squeeze and thus possibly damage other components under strong stress.

In particular, when the isolation plug 600 is formed right above the semiconductor device, strong internal stress in the isolation plug 600 may cause damage to the semiconductor device. As shown in FIG. 1, in this embodiment, the isolation plug 600 is formed right above the semiconductor device.

With continued reference to FIG. 1, in this embodiment, the semiconductor device may include, for example, at least one transistor. The transistor may include a gate conductive layer 200 on a top surface of the substrate 100 and first and second source/drain regions 110, 120 formed in the substrate 100, the first and second source/drain regions 110, 120 are formed respectively on opposing sides of the gate conductive layer 200.

In this embodiment, the gate conductive layer 200 may include a third conductive layer 210, a fourth conductive layer 220 and a fifth conductive layer 230, which are stacked one on another. The third conductive layer 210 may be made of a material including, for example, polysilicon. The fourth conductive layer 220 may be made of a material including, for example, titanium nitride. The fifth conductive layer 230 may be made of a material including, for example, tungsten.

The interlayer dielectric layer 300 may include a shielding layer 310 covering a top surface of the gate conductive layer 200. The contact plug 410 may be located beside the gate conductive layer 200 and a lower end of the contact plug 410 may vertically extend downward to the first source/drain region 110 or second source/drain region 120 in the substrate 100. In this way, electrical connection of the first and second source/drain regions 110, 120 can be accomplished with at least two such contact plugs 410. The top of the contact plug 410 may be higher than that of the gate conductive layer, and the first contact pad 420 may extend from a side edge of the gate conductive layer 200 over the shielding layer 310. That is, the first contact pad 420 is located at least partially above the gate conductive layer 200.

In this embodiment, the second contact pad 500 may reside on the shielding layer 310 and be spaced apart from the first contact pad 420. In this embodiment, trench 600a between the first and second contact pads 420, 500 may be formed partially in the shielding layer 310, and the isolation plug 600 may be filled in a corresponding portion of the shielding layer 310. That is, there may be an overlap between projections of the isolation plug 600 and the gate conductive layer 200 in the height-wise direction.

The distance between the first and second contact pads 420, 500 and the widths of the first and second contact pads 420, 500 may be configured as actually required. Specifically, the distance between the first and second contact pads 420, 500 and the widths of the first and second contact pads 420, 500 may be configured according to the resolution accuracy of the current photolithography and etching processes, as long as the density of pattern features is allowed by the resolution accuracy of the current processes.

For example, the distance between the first and second contact pads 420, 500 may be smaller than a width of the gate conductive layer 200. In this way, it can be ensured that the second contact pad 500 can effectively protect the first contact pad 420 during the formation of the first contact pad 420.

In this embodiment, a width of the first contact pad 420 over the shielding layer 310 may be smaller than the width of the second contact pad 500. Since the first contact pad 420 extends from an out edge of the shielding layer 310 toward a middle of the shielding layer 310, and since the second contact pad 500 is formed above the shielding layer 310, the width of the first contact pad 420 over the shielding layer 310 smaller than the width of the second contact pad 500 means that the trench 600a between the first and second contact pads 420, 500 is deviated from the middle of the shielding layer 310. In addition, the groove 600a is deviated from the middle of the shielding layer 310 toward the first contact pad 420.

With continued reference to FIG. 1, the interlayer dielectric layer 300 may further include a spacer 320 covering a side surface of the gate conductive layer 200. In this embodiment, the spacer 320 may further cover a side surface of the shielding layer 310. Moreover, the contact plug 410 may be formed on the side of the spacer 320 away from the gate conductive layer 200, and the first contact pad 420 may extend laterally over the spacer 320 adjacent to the contact plug 410.

Specifically, the spacer 320 may be, for example, a stacked structure sequentially stacked over the gate conductive layer 200. In this embodiment, the spacer 320 may include a first spacing layer 321, a second spacing layer 322 and a third spacing layer 323, which are stacked over the gate conductive layer 200 sequentially in this order. The first and third spacing layers 321, 323 may be formed of the same material including, for example, silicon oxide, and the second spacing layer 322 may be formed of a material including, for example, silicon nitride. Therefore, in this case, the spacer 320 is an ONO structure.

The interlayer dielectric layer 300 may further include an isolation dielectric layer 330 external to the gate conductive layer 200. In this embodiment, the isolation dielectric layer 330 may surround the spacer 320, and the contact plug 410 may extend through the isolation dielectric layer 330.

In specific embodiments, at least two transistors may be formed on the substrate 100. In FIG. 1, only two transistors are schematically shown and share the first source/drain region 110. In addition, the contact plug 410 is electrically connected to this shared first source/drain region 110 and is located between the two transistors. Further, the first contact pad 420 laterally extends toward both the two transistors and over the gate conductive layers therein.

Figure 2:
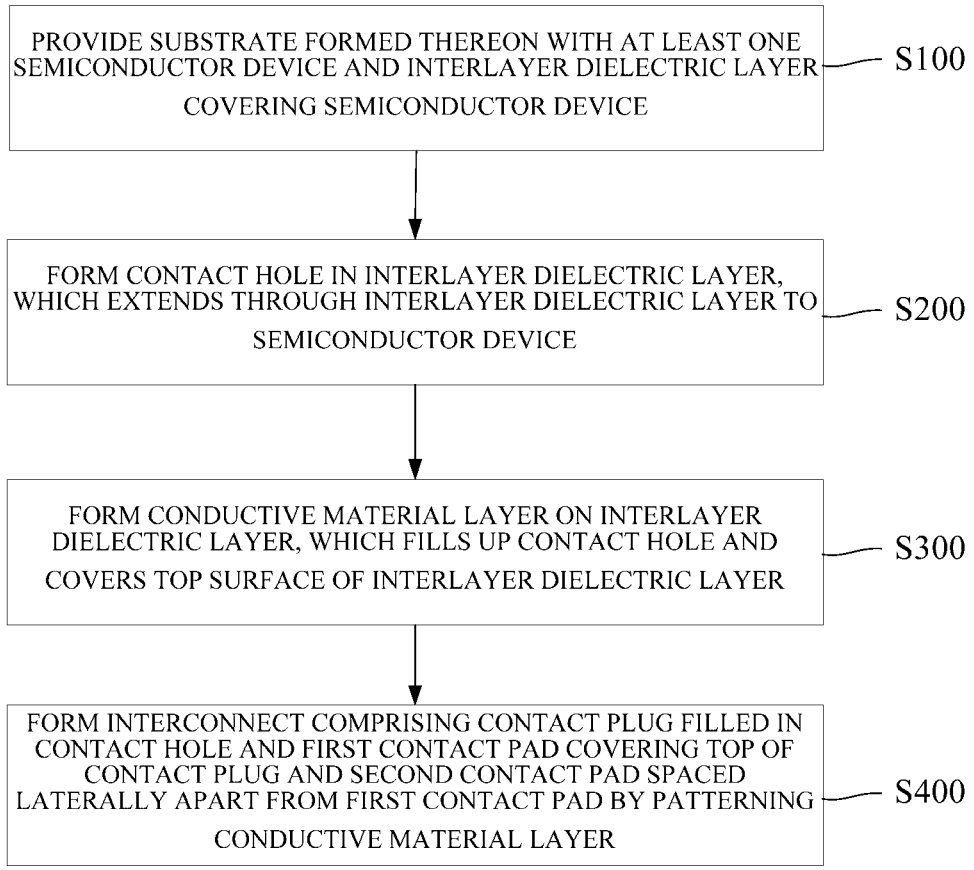
FIG. 2 is a flowchart of a method of fabricating a semiconductor structure according to an embodiment of the present invention.

A method of fabricating a semiconductor structure according to this embodiment will be described in detail below. FIG. 2 is a flowchart of the method according to an embodiment of the present invention, and FIGS. 3a to 3f are schematic illustrations of structures formed in the method according to an embodiment of the present invention.

Figure 3A:
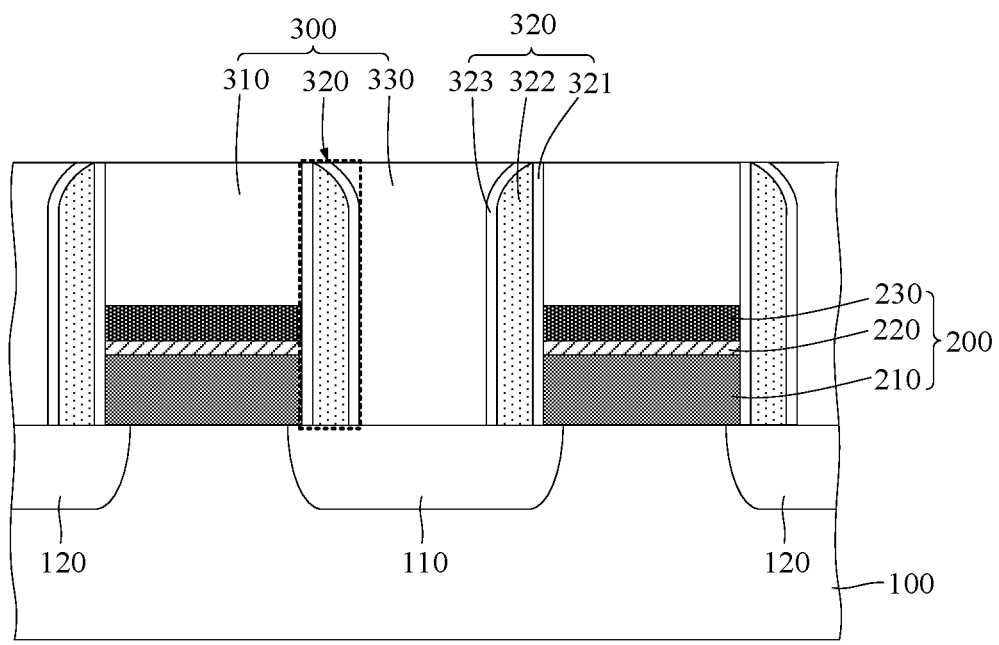
FIGS. 3a to 3f are schematic illustrations of structures formed in a method of fabricating a semiconductor structure according to an embodiment of the present invention.

First of all, step S100 is performed, in which, with particular reference to FIG. 3a, a substrate 100 is provided, and at least one semiconductor device and an interlayer dielectric layer 300 covering the semiconductor device are formed on the substrate 100.

In this embodiment, the semiconductor device may include a transistor. The transistor may include a gate conductive layer 200 on a top surface of the substrate 100 and first and second source/drain regions 110, 120 formed in the substrate 100.

The interlayer dielectric layer 300 may include a shielding layer 310 covering a top surface of the gate conductive layer 200. In this embodiment, the shielding layer 310 and the gate conductive layer 200 may be formed in the same photolithography process.

Specifically, the formation of the shielding layer 310 in the interlayer dielectric layer 300 and the gate conductive layer 200 may include the steps of:

i) forming a gate material layer and a shielding material layer sequentially over the substrate 100;

ii) forming the shielding layer 310 by patterning the shielding material layer using photolithography and etching processes; and iii) forming the gate conductive layer 200 by etching the gate material layer, with the shielding layer 310 serving as a mask.

In this embodiment, the gate material layer may consist of a stack of layers, and these layers may be etched through sequentially during the etching process. The resulting gate conductive layer 200 may be made up of a third conductive layer 210, a fourth conductive layer 220 and a fifth conductive layer 230.

Additionally, the formation of the interlayer dielectric layer 300 may further include forming a spacer 320 on side surfaces of the gate conductive layer 200 and the shielding layer 310.

With continued reference to FIG. 3a, the formation of the interlayer dielectric layer 300 may further include forming an isolation dielectric layer 330 external to the gate conductive layer 200. In this embodiment, the isolation dielectric layer 330 may surround the spacer 320.

The formation of the isolation dielectric layer 330 may involve a planarization process. Specifically, after a layer of the isolation dielectric material is deposited, a chemical mechanical polishing process may be performed on the layer, with the shielding layer 310 serving as a polishing stop layer, so that top surfaces of the resulting isolation dielectric layer 330 and the shielding layer 310 are flush with each other.

Figure 3B:
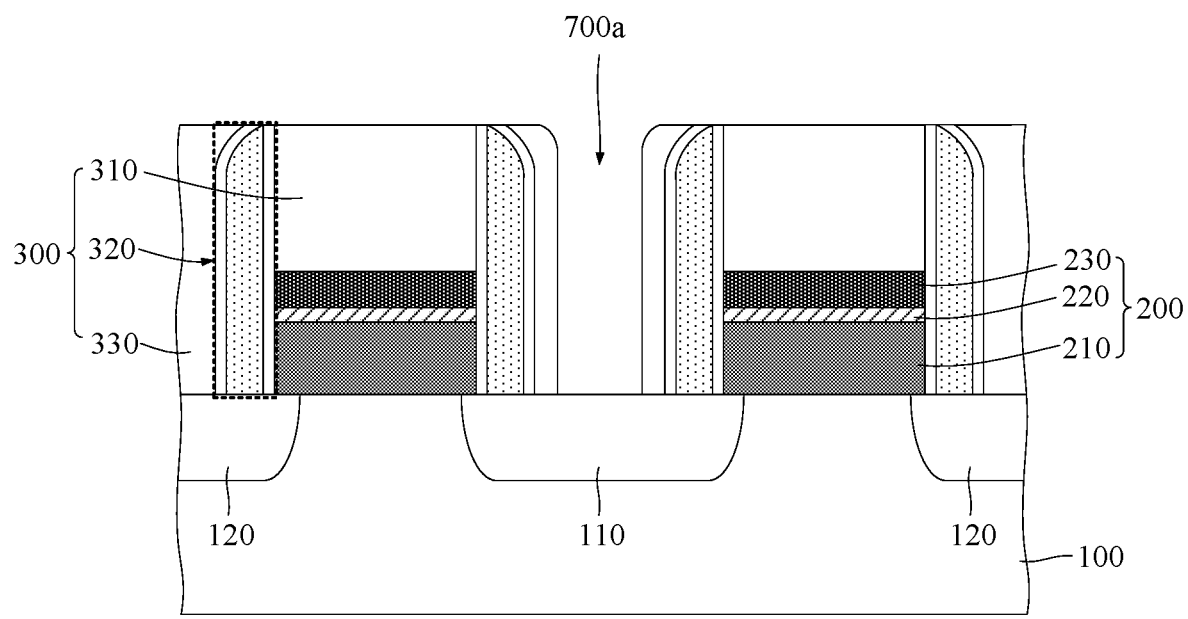

Step S200 is then performed, in which, with particular reference to FIG. 3b, a contact hole 700a is so formed in the interlayer dielectric layer 300 as to extend through the interlayer dielectric layer 300 to the semiconductor device.

In this embodiment, the contact hole 700a may extend through the isolation dielectric layer 330 to the top surface of the substrate 100, thus exposing the underlying substrate 100.

Figure 3C:
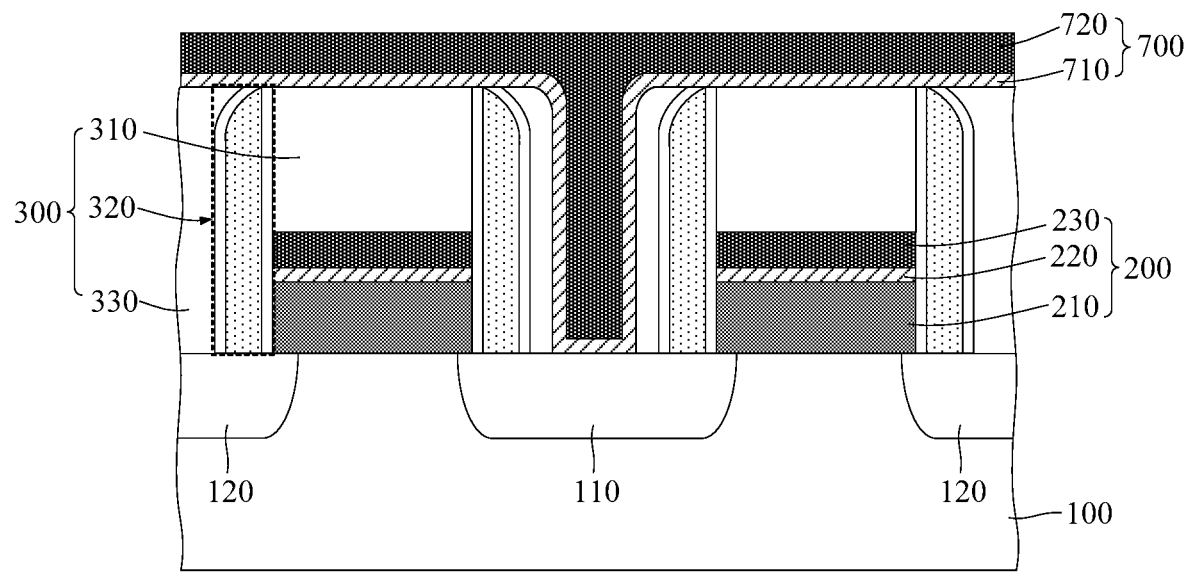

Step S300 is then performed, in which, with particular reference to FIG. 3c, a conductive material layer 700 is formed on the interlayer dielectric layer 300 so as to fill the contact hole 700a and cover the top surface of the interlayer dielectric layer 300.

Specifically, the formation of the conductive material layer 700 may be accomplished by a deposition process and a planarization process. More specifically, the formation of the conductive material layer 700 may include the steps of:

i) depositing a first conductive layer 710 over the interlayer dielectric layer 300, the first conductive layer 710 covers an inner surface of the contact hole 700a and the top surface of the interlayer dielectric layer 300 with geometric conformity therewith; and ii) forming a second conductive layer 720 on the first conductive layer 710, the second conductive layer 720 fills up the contact hole 700a and extends over the top surface of the interlayer dielectric layer 300. The second conductive layer 720 may be planarized, so that the second conductive layer 720 has a flat top surface.

Figure 3D:
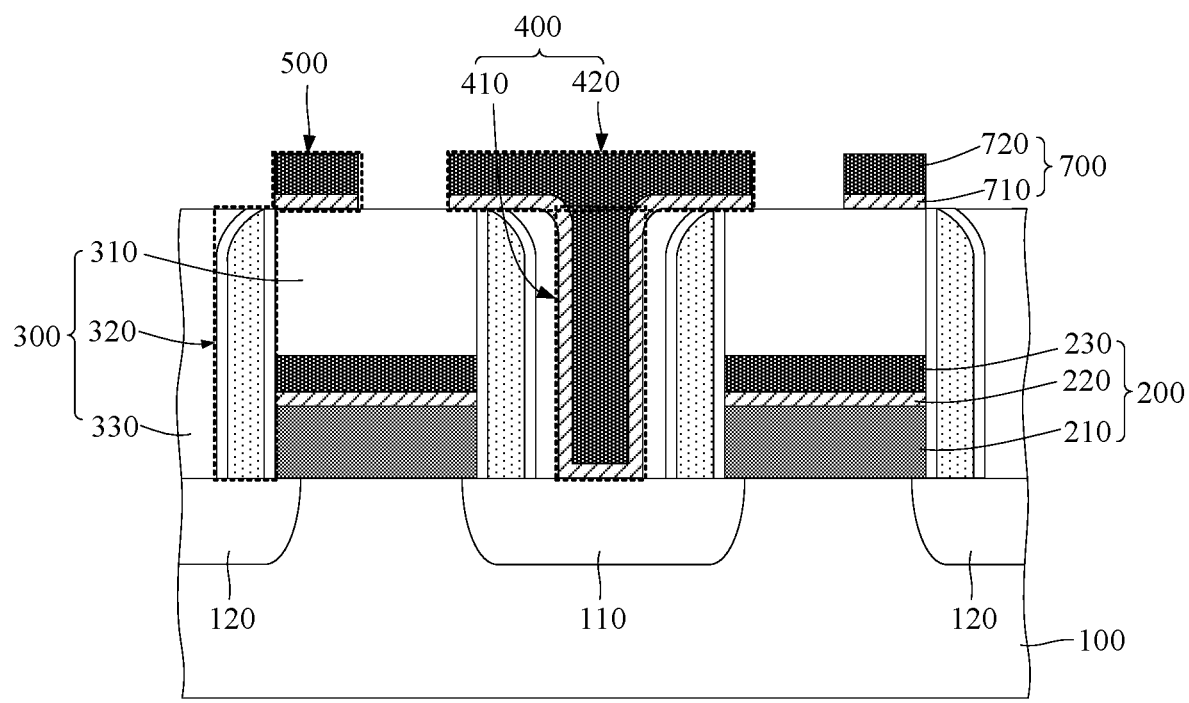

Step S400 is then performed, in which, with particular reference to FIG. 3d, an interconnect structure 400 and a second contact pad 500 are formed by patterning the conductive material layer 700. The interconnect structure 400 includes a contact plug 410 in the contact hole and a first contact pad 420 covering a top of the contact plug 410. The second contact pad 500 is spaced laterally apart from the first contact pad 420.

Specifically, the formation of the interconnect structure 400 and the second contact pad 500 by patterning the conductive material layer 700 may include the following steps.

At first, a mask layer (not shown) is formed on the conductive material layer 700, the mask layer has a first mask pattern and a second mask pattern. The first mask pattern corresponds to the interconnect structure and the second mask pattern corresponds to the second contact pad. The first mask pattern encompasses the contact hole and an area surrounding the contact hole, and the second mask pattern is located lateral to the first mask pattern and is spaced apart from the first mask pattern by a predetermined distance.

Subsequently, the interconnect structure 400 corresponding to the first mask pattern and the second contact pad 500 corresponding to the second mask pattern are formed by etching the conductive material layer 700 with the mask layer as an etching mask.

In this embodiment, the first contact pad 420 extends laterally from the contact plug 410 over the shielding layer 310, and the second contact pad 500 is at least partially formed on the shielding layer 310 and is spaced from the first contact pad 420 by the predetermined distance.

Figure 3E:
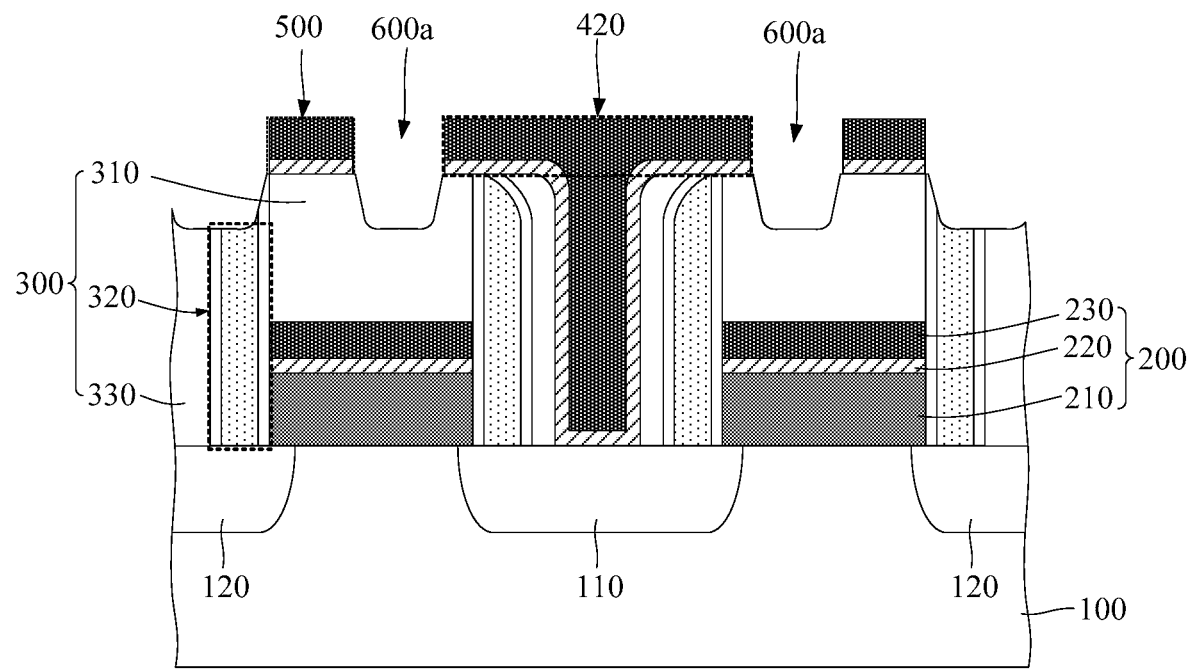

Optionally, with particular reference to FIG. 3e, subsequent to the etching of the conductive material layer 700, the method may further include forming a trench 600a by performing an etching process on the interlayer dielectric layer 300 between the first and second contact pads 420, 500 and stopping the etching process in the interlayer dielectric layer 300. In this way, separation of the first and second contact pads 420, 500 from each other can be ensured.

Specifically, the trench 600a may be formed by etching the exposed interlayer dielectric layer 300 with the first and second contact pads 420, 500 serving as etching masks. In this embodiment, the trench 600a between the first and second contact pads 420, 500 may extend downward into the shielding layer 310 and be located right above the gate conductive layer 200. In addition, in this embodiment, another trench may also be formed on the side of the second contact pad 500 away from the first contact pad 420.

Figure 3F:
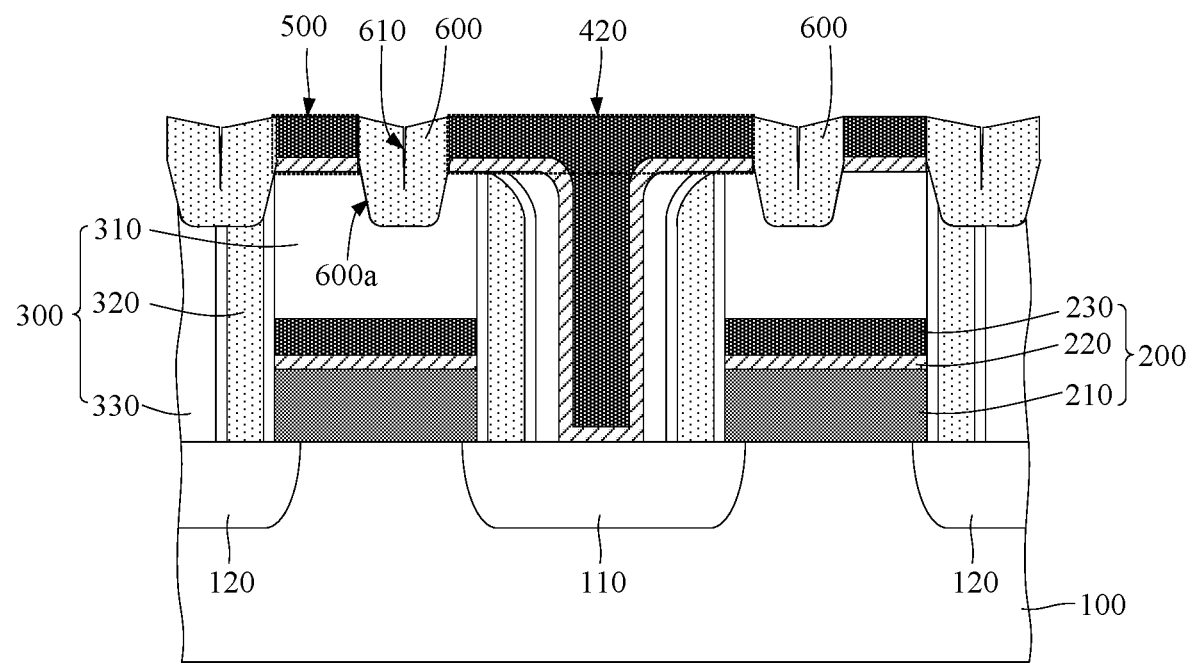

With particular reference to FIG. 3f, the method may further include filling the trench 600a with an isolation plug 600. The isolation plug 600 may cover side surfaces of the first and second contact pads 420, 500 exposed in the trench 600a.

In this embodiment, a gap 610 may be formed in the isolation plug 600 in order to facilitate stress relief of the isolation plug 600. For example, the gap 610 may extend vertically at the middle of the trench 600a along the heightwise direction.

In summary, in the semiconductor structures according to embodiments of the present invention, the presence of the second contact pad beside the first contact pad in the interconnect structure avoids the first contact pad from being present in a large bland area. In this way, during the fabrication of the interconnect structure, as the first contact pad is not present alone in a large bland area due to the presence of the second contact pad, a pattern feature for the first contact pad will not be over-resolved, increasing formation accuracy of the first contact pad and thus guaranteeing good electrical transmission performance of the resulting interconnect. This can be alternatively interpreted as ensuring good morphological quality of the first contact pad by improving resolution accuracy of the pattern feature for the first contact pad through adjusting a density of pattern features around the area of the first contact pad.

It is to be noted that, while the invention has been described with reference to several preferred embodiments, it is not intended to be limited to these embodiments in any way. In light of the teachings hereinabove, any person of skill in the art may make various possible variations and changes to the disclosed embodiments or modify them into equivalent alternatives, without departing from the scope of the invention. Accordingly, any and all such simple variations, equivalent alternatives and modifications made to the foregoing embodiments without departing from the scope of the invention are intended to fall within the scope thereof.

It is to be noted that, as used herein, the terms "first", "second" and the like are only meant to distinguish various components, elements, steps, etc. from each other rather than necessarily indicate logical or sequential orderings thereof, unless otherwise indicated or specified.

It is also to be understood that the terminology used herein is used for the purpose of describing particular embodiments only, and is not intended to limit the scope of the present invention. It must be noted that as used herein and in the appended claims, the singular forms "a" and "an" include the plural reference unless the context clearly dictates otherwise. Thus, for example, a reference to "a step" or "a means" is a reference to one or more steps or means and may include sub-steps and subservient means. All conjunctions used are to be understood in the most inclusive sense possible. Thus, the term "or" should be understood as having the definition of a logical "or" rather than that of a logical "exclusive or" unless the context clearly necessitates otherwise. Implementation of the methods and/or device according to the embodiments of the present invention involves performing or completing certain selected tasks or steps manually, automatically, or a combination thereof.

What is claimed is:

1. A semiconductor structure, comprising:
a substrate on which at least one semiconductor device and an interlayer dielectric layer are formed, the interlayer dielectric layer covering each semiconductor device;
an interconnect structure comprising a contact plug and a first contact pad, the contact plug extending through the interlayer dielectric layer to the substrate, the first contact pad fully covering a top of the contact plug and extending laterally over part of a top surface of the interlayer dielectric layer; and
a second contact pad formed on the top surface of the interlayer dielectric layer and spaced apart from a side edge of the first contact pad,
wherein the semiconductor device comprises a gate conductive layer formed on a top surface of the substrate, wherein the interlayer dielectric layer comprises a shielding layer covering a top surface of the gate conductive layer, wherein the contact plug is formed on a side edge of the gate conductive layer, and wherein the first contact pad extends laterally from the side edge of the gate conductive layer over the shielding layer,
wherein the second contact pad is formed and fully overlays on the shielding layer and an isolation plug is spaced apart from the first contact pad.

2. The semiconductor structure of claim 1, wherein a width of the first contact pad over the shielding layer is smaller than a width of the second contact pad.

3. The semiconductor structure of claim 1, wherein the interlayer dielectric layer further comprises an isolation spacer covering a side surface of the gate conductive layer, wherein the contact plug is formed on a side of the isolation spacer away from the gate conductive layer, and wherein the first contact pad extends laterally over the isolation spacer adjacent to the contact plug.

4. The semiconductor structure of claim 1, wherein the interlayer dielectric layer further comprises an isolation dielectric layer surrounding the gate conductive layer, and wherein the contact plug extends through the isolation dielectric layer.

5. The semiconductor structure of claim 1, wherein the first and second contact pads are made of the same materials.

6. The semiconductor structure of claim 5, wherein each of the first and second contact pads comprises a first conductive layer and a second conductive layer formed on the first conductive layer, the first conductive layer in the first contact pad made of the same material as the first conductive layer in the second contact pad, the second conductive layer in the first contact pad made of the same material as the second conductive layer in the second contact pad.

7. The semiconductor structure of claim 1, wherein the isolation plug penetrates into the shielding layer.

8. The semiconductor structure of claim 1, wherein the isolation plug is formed with a gap and a bottommost of the isolation plug directly contacts at least two different material.

9. The semiconductor structure of claim 1, wherein the first contact pad and the second contact pad have a same height.

10. A semiconductor structure, comprising:
a substrate on which at least one semiconductor device and an interlayer dielectric layer are formed, the interlayer dielectric layer covering each semiconductor device;
an interconnect structure comprising a contact plug and a first contact pad, the contact plug extending through the interlayer dielectric layer to the semiconductor device, the first contact pad covering a top of the contact plug and extending laterally over part of a top surface of a shielding layer of the interlayer dielectric layer;
a second contact pad formed on the top surface of the interlayer dielectric layer and spaced apart from a side edge of the first contact pad; and
a trench between the first and second contact pads, the trench extending downward into the interlayer dielectric layer,
wherein the semiconductor device comprises a gate conductive layer formed on a top surface of the substrate, wherein the shielding layer covers a top surface of the gate conductive layer, wherein the contact plug is formed on a side edge of the gate conductive layer, and wherein the first contact pad extends laterally from the side edge of the gate conductive layer over the shielding layer,
wherein the second contact pad is formed and fully overlays on the shielding layer and an isolation plug is spaced apart from the first contact pad.

11. The semiconductor structure of claim 10, wherein a side surface of the first contact pad and a side surface of the second contact pad are both partially exposed in the trench, and wherein the isolation plug fills the trench and covering the side surfaces of the first and second contact pads exposed in the trench.

12. The semiconductor structure of claim 11, wherein a gap is formed in the isolation plug and a bottommost of the isolation plug directly contacts at least two different material.

13. The semiconductor structure of claim 10, wherein the trench between the first and second contact pads extends downward into the shielding layer.

14. A method of fabricating a semiconductor structure, the method comprising:
providing a substrate formed thereon with at least one semiconductor device and an interlayer dielectric layer covering the semiconductor device;
forming a contact hole in the interlayer dielectric layer, the contact hole extending through the interlayer dielectric layer to the semiconductor device;
forming a conductive material layer on the interlayer dielectric layer, the conductive material layer filling the contact hole and covering a top surface of the interlayer dielectric layer;
forming an interconnect structure and a second contact pad by patterning the conductive material layer, the interconnect structure comprising a contact plug filled in the contact hole and a first contact pad covering a top of the contact plug, the second contact pad spaced apart from a side edge of the first contact pad; and
performing an etching process on the interlayer dielectric layer between the first and second contact pads and stopping the etching process in the interlayer dielectric layer to form a trench.

15. The method of fabricating a semiconductor structure of claim 14, wherein patterning the conductive material layer comprises:
forming a mask layer on the conductive material layer, the mask layer having a first mask pattern and a second mask pattern, the first mask pattern covering the contact hole and a partial area surrounding the contact hole, the second mask pattern formed on a side edge of the first mask pattern and spaced apart from the first mask pattern by a predetermined distance; and
etching the conductive material layer with the mask layer serving as an etching mask to form the interconnect structure corresponding to the first mask pattern and the second contact pad corresponding to the second mask pattern.

16. The method of fabricating a semiconductor structure of claim 14, wherein a side surface of the first contact pad and a side surface of the second contact pad are both partially exposed in the trench, and wherein the method further comprises, subsequent to formation of the trench,
filling the trench with an isolation plug, the isolation plug covering the side surface of the first contact pad and the side surface of the second contact pad exposed in the trench.

17. The method of fabricating a semiconductor structure of claim 16, wherein a gap is formed in the isolation plug.

* * * * *